United States Patent [19]
Chia et al.

[11] Patent Number: 5,841,191
[45] Date of Patent: Nov. 24, 1998

[54] BALL GRID ARRAY PACKAGE EMPLOYING RAISED METAL CONTACT RINGS

[75] Inventors: Chok J. Chia; Qwai H. Low; Maniam Alagaratnam, all of Cupertino, Calif.

[73] Assignee: LSI Logic Corporation, Milpitas, Calif.

[21] Appl. No.: 837,530

[22] Filed: Apr. 21, 1997

[51] Int. Cl.$^6$ .............................. H01L 23/52; H01L 23/48
[52] U.S. Cl. ......................... 257/691; 257/690; 257/692; 257/698
[58] Field of Search ................................. 157/690, 691, 157/692, 698

[56] References Cited

U.S. PATENT DOCUMENTS 5,592,025  1/1997  Clark et al. ............................ 257/774
5,681,777  10/1997  Lynch et al. ........................... 437/182

*Primary Examiner*—Ngân V. Ngô

[57] ABSTRACT

A ball grid array package in which one or more conductive rings are positioned on a surface of the package substrate along with solder bond contacts on the surface of the substrate to facilitate the interconnection of wire bonds to an integrated circuit chip on the surface of the substrate. The use of rings allows for better distribution of power to the chip since a plurality of wires can be connected between the chip and the conductive rings for power distribution. The rings create a different shelf for the power and ground bonds on the substrate, and by providing a vertical separation between the surfaces of the rings and bonding pads on the surface of the substrate more bonds in the package can be accommodated.

12 Claims, 1 Drawing Sheet

BALL GRID ARRAY PACKAGE EMPLOYING RAISED METAL CONTACT RINGS

BACKGROUND OF THE INVENTION

This invention relates generally to semiconductor integrated circuit packages, and more particularly the invention relates to ball grid array package with compact wire bond interconnections.

The semiconductor integrated circuit chip must be mounted and sealed on a supporting substrate with the substrate providing interconnect electrical leads for supplying electrical signals and voltages to and from the integrated circuit. The ball grid array package is presently used for housing and interconnecting large scale integrated circuits. See copending application Ser. No. 08/625,641 filed Mar. 29, 1996, now U.S. Pat. No. 5,681,777, incorporated herein by reference. Typically, the substrate is a rigid ceramic, for example, which includes metal lead patterns to which the chip contacts are wire bonded. Laminated substrates having multiple metal layers have been used as well as rigid tape substrates. Tape automated bonding (TAB) is typically used with the rigid tape substrates. Solder balls are used to interconnect the substrate leads to electrical contacts on a mother board on which the substrate is mounted as a component in a larger circuit or system.

The two generic constructions for ball grid array packages are die up and die down configurations. In the die up configuration, the chip is attached to the top surface of the substrate and the balls are attached bottom face. In the die down configuration, the chip and balls are on the same surface of the substrate. In the die up configuration, the substrate generally has two metal layers, one on each surface of the substrate. Vias are formed in the substrate to interconnect the two metal layers.

Disclosed in copending patent applications filed by Applicants are ball grid array packages which use substrates of flex tape, alone or with metallic heatspreaders. These packages are more economical, smaller in size and weight, and easier to manufacture.

In the prior art packages and the packages of the copending applications, separation of the wire bonds limits the density of bonding wires on the package substrate. The present invention is directed to increasing bonding wire density in ball grid array package.

SUMMARY OF THE INVENTION

In accordance with the invention, bonding rings are provided on substrates of ball grid array packages which provide raised bonding surfaces for wire bonding. The rings are especially useful in interconnecting power buses to the integrated circuit. Power distribution is improved and more bond pads are accommodated in the package through use of multiple tier bond sites.

The invention and objects and features thereof will be more readily apparent from the following detailed description and appended claims when taken with the drawing.

DETAILED DESCRIPTION OF THE ILLUSTRATIVE EMBODIMENT

Figure 1:
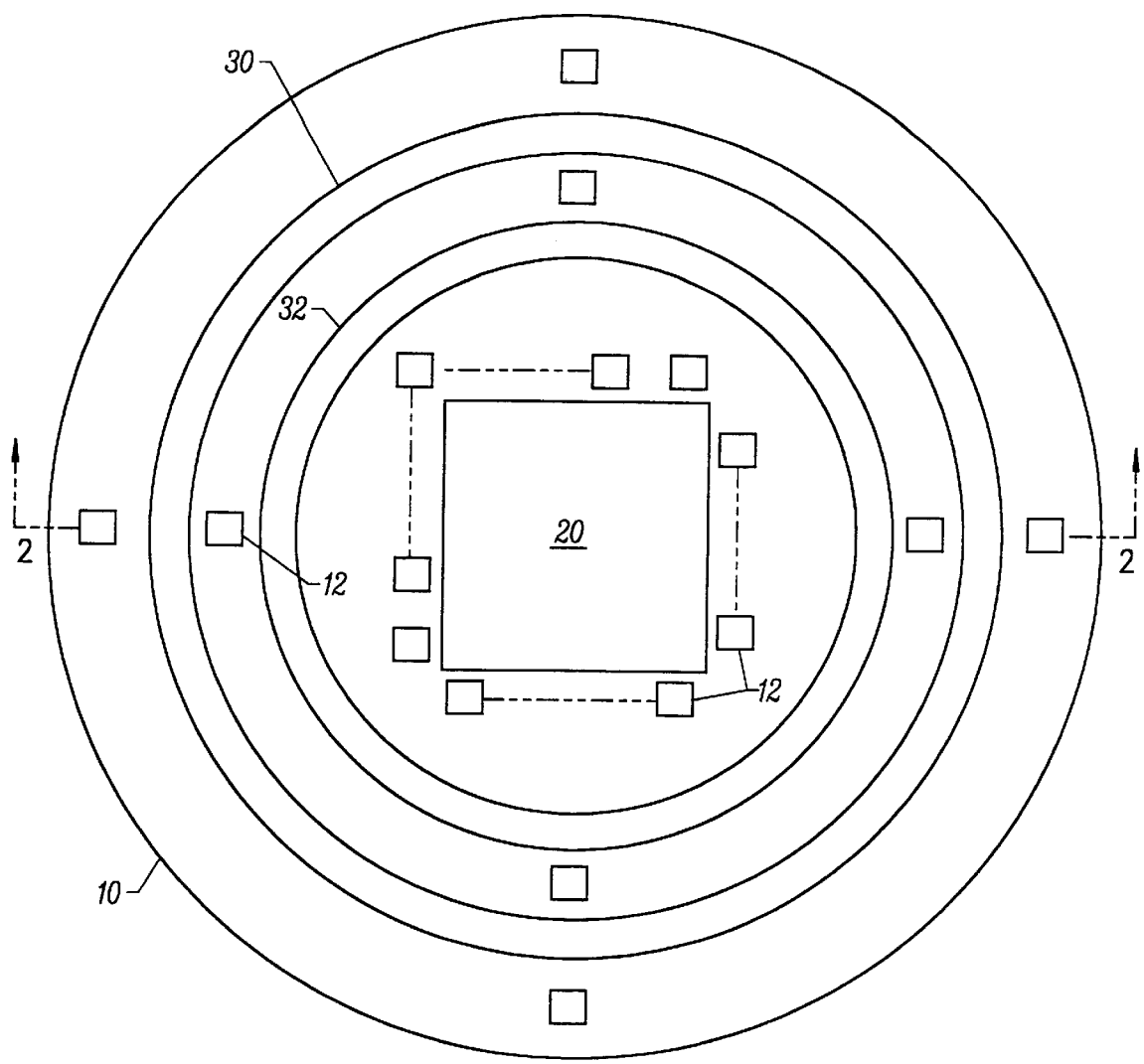
FIG. 1 is a top view of a ball grid array package illustrating the use of bonding rings in accordance with the invention.
Figure 2:
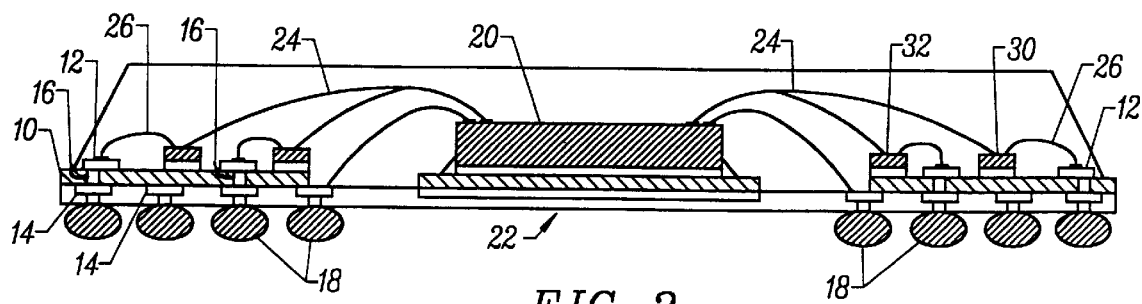
FIG. 2 is a section view of the package of FIG. 1 taken along the line 2—2.

FIG. 1 is a top view of an integrated circuit package in accordance with the invention, and FIG. 2 is a section view of the package of FIG. 1 taken along the line 2—2. The package includes a substrate 10 comprising flex tape, caminate or ceramic, having a metallic pattern on at least one surface and wire bond contacts 12 on the top surface. Some of the contacts on the top surface are interconnected with contacts 14 on the bottom surface through conductive vias 16. Solder balls 18 engage the bottom contacts 14 for connecting the package and integrated circuit 20 to a motherboard. A solder mask layer 22 protects the bottom surface of the substrate from solder.

Heretofore, the density of wire bonds 24 interconnecting the semiconductor chip 20 to bonding pads on the substrate have been limited in density in order to prevent shorting of wire bonds. In accordance with the present invention, one or more raised conductive rings such as rings 30 and 32 are mounted on the top surface of the substrate and provide elevated or raised bonding surfaces which increases the density of wire bonding pads and permits the use of adjacent bonding pads as illustrated in FIG. 2. The raised bonding surfaces of the conductive rings 30,32 are especially useful in interconnecting power buses such as VDD and VSS to the integrated circuit chip in a more uniformly distributed manner since a plurality of power bus bonding pads on the chip can be connected to the rings. The rings are made from metal, either stamped or etched and then plated on one surface for wire bonding, such as copper plated with gold. The rings are laminated onto the substrate surface using adhesive or other suitable materials such as double sided pressure sensitive tape. The rings are isolated from the metal traces on the substrate with an insulator, which can be an adhesive tape or solder mask material. The rings are made with sufficient thickness to provide a separation in the vertical direction between the wires bonded to them and wires bonded to substrate bond fingers. The rings can be connected to the substrate by wire bonds 26.

The use of rings having raised conductive surfaces for power and ground bonding improves the electrical performance and efficiency of the package and allows for better distribution of power to the chip, since more wires can be bonded to the ring for power and ground. By creating a different shelf for the power and ground bonds on the substrate, a low cost method of making a multiple shelf package is provided. The vertical separation allows for more bonds in the package than if all the bonds are on the same level.

While the invention has been described with reference to a specific embodiment, the description is illustrative of the invention and is not to be construed as limiting the invention. Various modifications and applications may occur to those skilled in the art without departing from the true spirit and scope of the invention as defined by the appended claims.

What is claimed is:

1. An integrated circuit package comprising:
   a substrate having a top surface, a bottom surface, a metal layer interconnect pattern, and a plurality of bonding pads on the top surface contacting the interconnect pattern,
   at least one conductive ring mounted on the top surface of the substrate and having a bonding surface raised above the top surface,
   an integrated circuit chip mounted on the top surface of the substrate, the chip having a plurality of bonding pads, and
   a plurality of wire bonds interconnecting bonding pads on the integrated circuit chip to bonding pads on the top surface of the substrate and to the bonding surface of the conductive ring.

2. The integrated circuit package as defined by claim 1 wherein the conductive ring provides a supply voltage with a plurality of wire bonds connecting the ring to the integrated circuit chip.

3. The integrated circuit package as defined by claim 2 and including two concentric conductive rings on the top surface for supplying two voltage levels (VDD, VSS) to the integrated circuit chip.

4. The integrated circuit package as defined by claim 3 wherein the metal layer interconnect pattern is on the top surface of the substrate.

5. The integrated circuit package as defined by claim 4 and further including a second metal layer interconnect pattern on the bottom surface of the substrate and interconnected with bonding pads on the top surface by vias through the substrate.

6. The integrated circuit package as defined by claim 5 and further including a plurality of solder ball pads on the bottom surface interconnected with bonding pads on the top surface by vias through the substrate.

7. The integrated circuit package as defined by claim 6 and further including a plurality of solder balls contacting the solder ball contacts for interconnecting the integrated circuit chip with a motherboard.

8. The integrated circuit package as defined by claim 3 and further including a plurality of solder ball pads on the bottom surface interconnecting with bonding pads on the top surface by vias through the substrate.

9. The integrated circuit package as defined by claim 8 and further including a plurality of solder balls contacting the solder ball contacts for interconnecting the integrated circuit chip with a motherboard.

10. The integrated circuit package as defined by claim 1 and further including a plurality of solder ball pads on the bottom surface of the substrate interconnected with bonding pads on the top surface by vias through the substrate.

11. The integrated circuit package as defined by claim 10 and further including a plurality of solder balls contacting solder ball contacts for interconnecting the integrated circuit chip with a motherboard.

12. The integrated circuit package as defined by claim 1 and further including a second metal layer interconnect pattern on the bottom surface of the substrate and interconnected with bonding pads on the top surface by vias through the substrate.

* * * * *